United States Patent [19]

Jeng et al.

[11] Patent Number: 5,289,411
[45] Date of Patent: Feb. 22, 1994

[54] FLOATING GATE MEMORY ARRAY DEVICE HAVING IMPROVED IMMUNITY TO WRITE DISTURBANCE

[75] Inventors: Ching S. Jeng, San Jose; Ping Wang, Saratoga, both of Calif.

[73] Assignee: Silicon Storage Technology, Inc., Sunnyvale, Calif.

[21] Appl. No.: 851,080

[22] Filed: Mar. 13, 1992

[51] Int. Cl.$^5$ .................. G11C 11/40; G11C 16/06
[52] U.S. Cl. .................... 365/185; 365/218; 365/226; 365/189.09
[58] Field of Search ............ 365/185, 218, 226, 189.09

[56] References Cited

U.S. PATENT DOCUMENTS

| | | | |
|---|---|---|---|
| 4,601,020 | 7/1986 | Arakawa et al. | 365/226 |
| 4,698,787 | 10/1987 | Mukherjee et al. | 365/185 |
| 4,949,309 | 8/1990 | Rao | 365/218 |
| 5,029,130 | 7/1991 | Yeh | 365/185 |
| 5,075,890 | 12/1991 | Itoh et al. | 365/189.09 |

*Primary Examiner*—Eugene R. LaRoche
*Assistant Examiner*—Son Mai
*Attorney, Agent, or Firm*—Limbach & Limbach

[57] ABSTRACT

An electrically programmable and erasable floating gate memory array device is disclosed. The array has a plurality of column address lines, a plurality of row address lines, and a plurality of common source lines. Each of the memory cells has one terminal connected to one of the column address lines, another one connected to one of the row address lines, and a third connected to one of the common source lines. By appropriate selection circuit, a high voltage source can be connected to either the row address line to effect erasure of charges on the floating gate of the memory cells connected to the selected row address line or to the common source line to selectively program the memory cells connected to the associated common source line. In this manner, write disturbance can be limited.

13 Claims, 3 Drawing Sheets

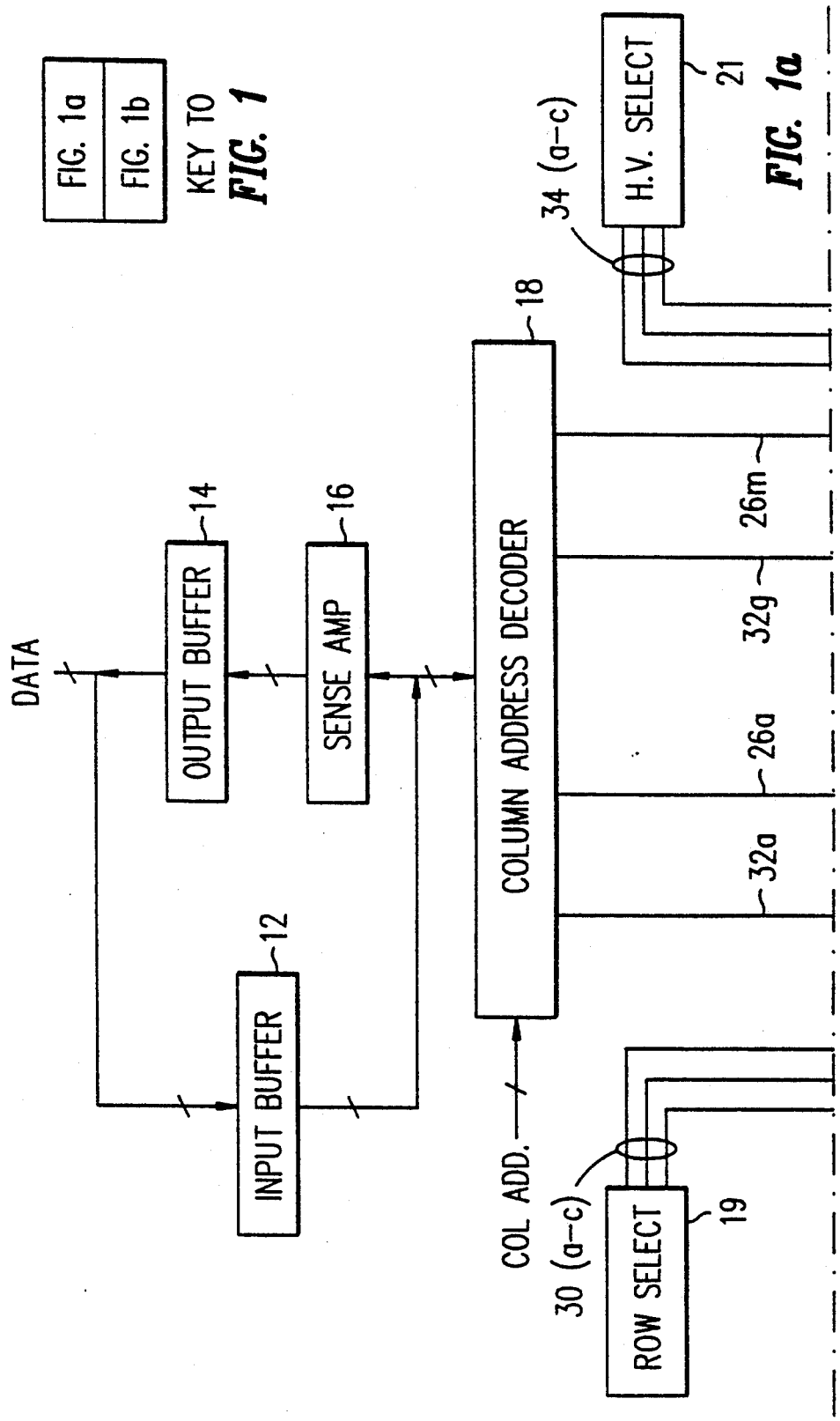

FLOATING GATE MEMORY ARRAY DEVICE HAVING IMPROVED IMMUNITY TO WRITE DISTURBANCE

TECHNICAL FIELD

The present invention relates to an electrically programmable and erasable memory array device having a plurality of memory cells with each having a floating gate for the storage of charges thereon. More particularly, the present invention relates to such a floating gate memory array device having improved immunity to write disturbance.

BACKGROUND OF THE INVENTION

Electrically programmable and erasable memory array devices using floating gate for the storage or charges thereon are well known in the art. See, for example, U.S. Pat. No. 4,698,787.

In U.S. Pat. No. 5,029,130, assigned to the present assignee, which is incorporated herein by reference, a novel type of EEPROM or flash EEPROM memory device is disclosed. In that application, the programming and erase operation can be selectively performed on a single row. However, although the programming operation is selectively performed on a single row, there may be undesired disturbance on the same column lines. In U.S. Patent Application 682,459, filed on Apr. 9, 1991, which is also assigned to the present assignee and is incorporated herein by reference, another type of EEPROM memory device is disclosed. In that application, the memory array can be programmed and erased on a selective row basis. However, similar to the invention disclosed in U.S. Pat. No. 5,029,130, because progamming is accomplished by high voltage, i.e., greater than 10 volts, the high voltage may disturb the unselected cells due to the common ground line.

SUMMARY OF THE INVENTION

Accordingly, in the present invention, an electrically programmable and erasable memory device of the type having a plurality of memory cells with each having a floating gate for the storage of charges thereon is disclosed. The device comprises a plurality of first address lines, a plurality of second address lines, and a plurality of third address lines. Each of the memory cells has three terminals. A first terminal of the memory cell is connected to one of the first address lines. A second terminal of the memory cell is connected to one of the second address lines. A third terminal of the memory cell is connected to one of the third address lines. The memory array device further comprises a high voltage source means for supplying a high voltage source with means for selecting certain of said second address lines for connecting to said high voltage source means to cause erasure of charges on the floating gate of the memory cells connected to said selected second address line. Finally, the array device comprises means for selecting certain of said third address lines for connecting to said high voltage source means to cause programming of charges on the floating gate of the memory cells connected to said selected third address line.

BRIEF DESCRIPTION OF THE DRAWINGS

FIGS. 1-1b show a circuit diagram of the electrically programmable and erasable memory array device of the present invention having improved immunity to write disturbance.

DETAILED DESCRIPTION OF THE DRAWINGS

Figure 1B:
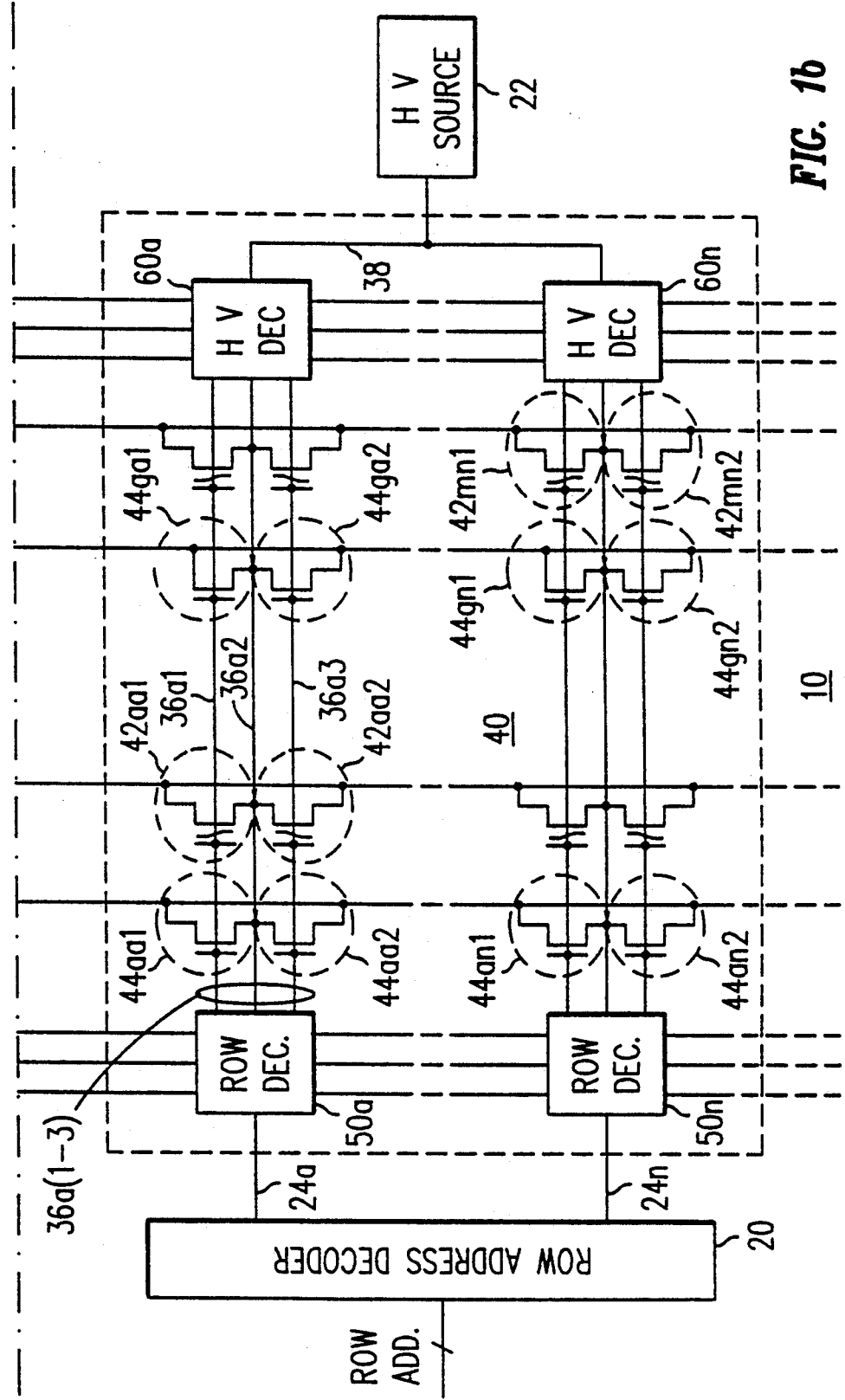

Referring to FIG. 1 there is shown a circuit diagram of the memory array device 10 of the present invention. The memory array device 10 comprises an array 40 of floating gate memory cells 42, which will be described hereinafter. The device 10 also comprises an input buffer 12 for receiving input data which is to be stored in the memory cells 42 of the array 40. In addition, the device 10 comprises a sense amplifier 16 whose output is connected to an output buffer 14 for supplying the readout of the data stored in the array 40.

The device 10 also comprises a column address decoder 18 for receiving a column address and for generating an address signal which is supplied along a plurality of column address lines 26(a-m). The plurality of column address lines 26(a-m) are substantially parallel to one another. In addition, the device 10 comprises a row address decoder 20, which receives a row address and generates a plurality of row address signals which are supplied along the plurality of row address lines 24(a-n). The plurality of row address lines 24(a-n) are also substantially parallel to one another and are substantially perpendicular to the plurality of column address lines 26(a-m). The plurality of row address lines 24(a-n) and column address lines 26(a-m) form an array. Finally, the device 10 comprises a source of high voltage 22 which provides a high voltage potential necessary to program or to store charges on the floating gate of the memory cells 42 in the array 40 or to erase the charges on the floating gate of the memory cells 42 in the array 40.

As previously discussed, the memory array 40 comprises a plurality of memory cells 42, each of which has a floating gate for the storage of charges thereon. The memory cells 42 are arranged in an array 40. Associated with each row address line 24 and each column address line 26 are two memory cells 42xy1 and 42xy2 (wherein x denotes the column address line and y denotes the row address line).

Each row address line 24 is connected to a row decoding circuit 50 (which will be described in detail hereinafter). The row decode circuit 50 also receives three row select lines 30(a-c) generated by the row select decoder 19. The output of the row decode circuit 50 is a plurality of row lines 36y(1-3), where y denotes the row address line 24 which caused the generation of the three row lines 36y(1-3). At the intersection of each of the three row lines 36 and one of the column address lines 26 are two memory cells 42.

The memory cells 42 can be of the type described in U.S. Pat. No. 5,029,130, or Ser. No. 682,459, filed on Apr. 9, 1991, which are incorporated herein by reference. Each of the memory cells 42 is a single transistor floating gate memory cell having a source, a drain and a gate. As is well known in semiconductor circuit technology, the term source and drain can be used interchangeably. As described in those applications, the memory cell programs by the mechanism of hot electron injection from the drain (or source) to the floating gate, and erases by the mechanism of Fowler-Nordheim tunnelling from the floating gate to the control gate.

In the preferred embodiment, each of the memory cells 42 is of the type described in copending U.S. application Ser. No. 682,459, filed on Apr. 9, 1991. As described in that application, each of the memory cells 42 has the following characteristics.

|  | DRAIN | GATE | SOURCE |
|---|---|---|---|
| PROGRAM | 0/+5 | $V_t$ | +12 |
| ERASE | 0 | +15 | 0 |
| READ | +2 | +5 | 0 |

The interconnection of each of the memory cells 42 to the row lines 36y(1-3) and the column address line 26 is as follows:

The drain of memory cells 42xy1 and 42xy2 are connected to the column address line 26. The source of the memory cells 42xy1 and 42xy2 are both connected to the row line 36y2 (which shall be hereinafter designated as the common line). The gate of the memory cell 42xy1 is connected to the row line 36y1. The gate of the memory cell 42xy2 is connected to the row line 36y3.

Each of the three row lines 36(a-n)(1-3) is also connected to a high voltage decode circuit 60. The high voltage decode circuit 60 (which is shown in greater detailed in FIG. 2) also receives three HV select signals 34(a-c) generated by the HV Row Select Decoder 21. The input of each HV decode circuit 60 is the HV line 38 connected to the plurality of HV decode circuits 60 and to a source of high voltage 22.

Finally, the memory array 40 comprises a plurality (such as 8 or 16) of common ground lines 32(a-g), repeated for every fixed number of column lines 26. The common ground lines 32 are substantially parallel to the plurality of column address lines 26(a-m) and are substantially perpendicular to the plurality of row lines 36(a-n)(1-3). The common ground lines 32 intersect each of the row lines 36y(1-3). At the intersection of each common ground line 32 with each of the row lines 36y are two switch transistor 44xy(1-2). The manner of connecting the switch transistor 44xy(1-2) to the row lines 36y(1-3) and to the common ground line 32 is as follows.

The gate of the switch transistor 44xy1 is connected to the row line 36y1. The gate of the switch transistor 44xy2 is connected to the row line 36y3. The source (or the drain) of the switch transistors 44xy1 and 44xy2 are both connected to the common line 36y2. Finally, the drain (or the source) of the switch transistors 44xy1 and 44xy2 are connected to the common ground line 32.

Figure 2:
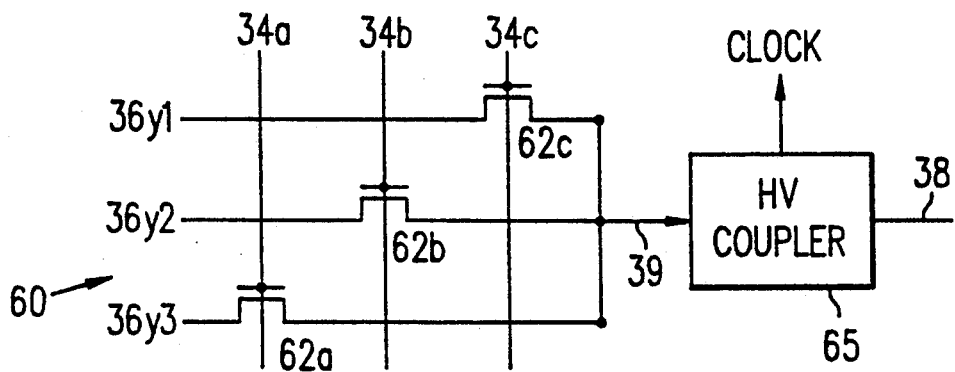
FIG. 2 is a circuit diagram of the high voltage decode circuit portion associated with each row of the memory array shown in FIG. 1.

Referring to FIG. 2 there is shown in greater circuit detail one embodiment of the HV decode circuit 60. As previously stated, the HV decode circuit 60 is connected to the row lines 36y(1-3), which are substantially parallel to one another. In addition, the HV decode circuit 60 receives a plurality of HV row select lines 34(a-c) which are substantially parallel to the column address lines 26(a-m), which are substantially perpendicular to the row lines 36y(1-3).

At the intersection of each of the HV select line 34(a-c) and the row lines 36y(1-3) is a switch transistor 62(a-c). The gate of each of the switch transistor 62 is connected to one of the HV select lines 34(a-c). The source (or the drain) of each of the switch transistors 62 is connected to the row line 36y. The drain (or the source) of each of the switch transistors 62(a-c) are all connected together to the output line 39 of a high voltage coupler 65, which is connected to the output 38 of the high voltage source 22.

Figure 3:
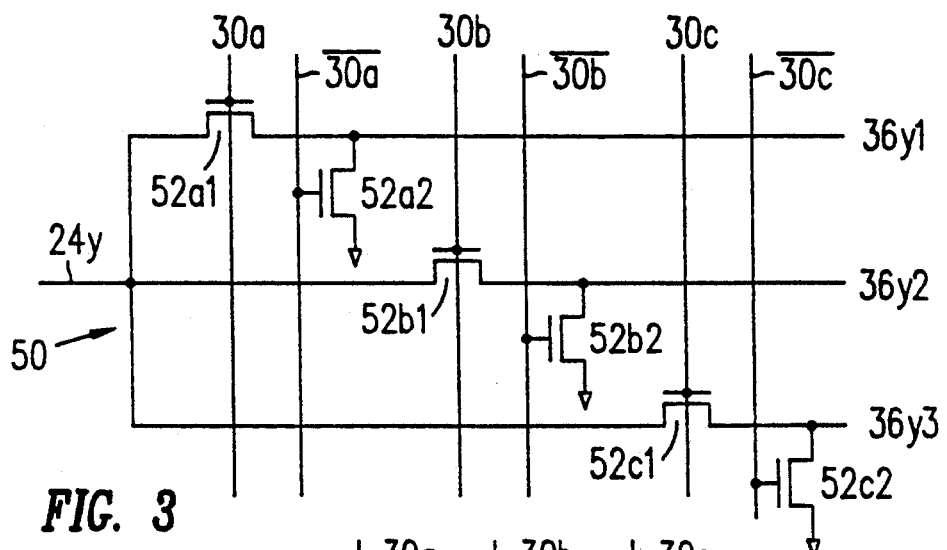
FIG. 3 is one embodiment of a circuit diagram of the row decode circuit portion of the memory array device shown in FIG. 1.

Referring to FIG. 3 there is shown one embodiment of the row decode circuit 50. The row decode circuit 50 receives a single row address line 24y and a plurality of row select lines 30(a-c) and generates as its output the three row lines 36y(1-3). In the embodiment shown in FIG. 3, the inverse of the row select lines 30(a-c), i.e., $\overline{30a}$, $\overline{30b}$, $\overline{30c}$, are also provided. At the intersection of each of the row lines 36y(1-3) with each of the row select lines 30(a-c) is a switch transistor 52(a-c)1. At the intersection of each of the row lines 36y(1-3) and each of the inverse to the row select lines 30(a-c) is another plurality of switch transistors 52(a-c)2.

The function of the transistors 52(a-c)2 is to discharge the unselected row line 36y. Thus, for example, if row address line 24y is high and row select line 30a is high, transistor 52a1 is turned on thereby bringing row line 36y1 high. At the same time, row select line $\overline{30b}$ and $\overline{30c}$ are both high. They will turn on transistors 52b2 and 52c2 which would bring down the row lines 36y2 and 36y3, the unselected row lines. Thus, in this embodiment when one of the row lines 36 is selected by the row select lines 30(a-c) the other two unselected row lines 36 will be held at ground potential.

Figure 4:
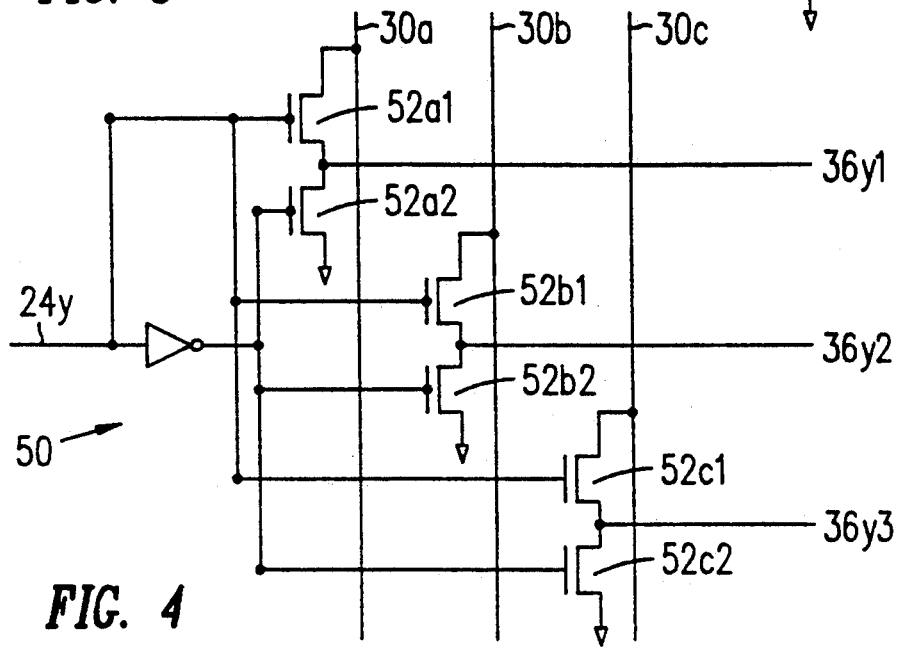
FIG. 4 is a preferred embodiment of a circuit diagram of the row decode circuit portion of the memory array device shown in FIG. 1.

Referring to FIG. 4 there is shown a preferred embodiment of the row decode circuit 50. In the embodiment shown in FIG. 4, if one of the row lines 36y(1-3) is selected, the unselected row line 36 may be maintained at a potential other than ground potential. The manner of accomplishing is as follows. When row address line 24y is activated, all of the transistors 52(a-c)1 are turned on. This would bring row line 36y1 to the voltage potential present on the row select line 30a. Row line 36y2 would be brought to the voltage potential present on row select line 30b. Row line 36y3 would be brought to the potential on the row select line 30c.

OPERATION OF THE MEMORY ARRAY 40

As previously stated, in the preferred embodiment, each of the memory cells 42 is of the type described in U.S. patent application Ser. No. 682,459, filed on Apr. 9, 1991, and has the programming, erase and read voltage characteristics discussed heretofore. The drain of each memory cell 42 is connected to a column address line 26, the gate of each memory cell 42 is connected to a row line 36y1 or 36y3, and the source of each memory cell 42 is connected to the common line 36y2. With respect to each of the operations, the array 40 functions as follows:

ERASE

When it is desired to erase a particular row 24y, the particular row address line 24 from the row address decoder 20 is activated. For the purpose of this discussion we shall assume that row address line 24a is activated. We shall also assume that all of the memory cells 42 whose gate is connected to the row line 36a1 is to be erased. Finally, we shall assume that the row decode circuit 50a is of the type shown in FIG. 4.

Thus, when row address line 24a is activated, row select line 30a is also high, with row select line 30b and 30c being held at ground potential. Thus, this results in row line 36a1 being high with row lines 36a2 and 36a3 being at ground potential. The high potential on row line 36a1 would turn on transistor 44aa1 connecting the common ground line 32 to the Common line 36a2. Within the HV decode circuit 60, HV select line 34c would be high turning on transistor 62c. Node 39 will then be raised high, i.e. one threshold below $V_{cc}$ and activate the high voltage coupler 65. Thus, row line 36a1 would then be connected to the high voltage source 22 which supplies a potential of +15 volts to the gate of each of the memory cells 42aa1, 42ba1 . . . 42ma1. This would cause all the memory cells 42 whose gate is connected to the row line 36a1 to be brought to +15 volts.

All of the column address lines 26(a–m) would be brought to ground potential thereby bringing the drain of each of the memory cells 42 to ground potential. Finally, since in most semiconductor memory circuits the common line 36a2 is made of conductive diffusion line, a fairly resistive element, the grounding of the common line 36a2 through transistor 44aa1 onto the common ground lines 32 would further bring the source of each of the memory cells 42xa1 to ground. Of course the common line 36a2 can also be made of metal, silicide or polycide. The common ground lines 32 are made of metal, and provides for greater conductance to a ground potential.

In this operation, the effect on the adjacent row of memory cells 42xa2 is as follows:
Drain-ground potential
Gate-ground potential
Source-ground potential With all three terminals of the adjacent row of memory cells 42 being grounded, the effect or the disturbance on the state of the adjacent memory cells is non-existent.

With respect to the disturbance on the other rows of memory cells 42, such as row 24n, the voltage on the memory cells 42 are as follows:
Drain-ground potential
Gate-ground potential
Source-ground potential Again, since all three terminals of the cell are grounded, there is no disturbance on the charging state of the floating gate.

PROGRAMMING

In the programming mode, we shall assume once again that the memory cells 42(a–m)a1 are to be programmed. The selected row address line 24a is brought the potential of $V_{cc}$. This would turn on transistor 52a1. The row select line 30a is brought to the potential of $V_t$, row select line 30b is brought to $V_{cc}$ and 30c is maintained at ground potential. The $+V_t$ volts on the row select line 30a is passed to the row line 36a1, and $V_{cc}-V_t$ is passed to 36a2.

The HV select line 34b is brought to a voltage potential sufficient to turn on transistor 62b and 34a and 34c are maintained at ground potential. This connects the row line 36a2 to node 39. The voltage of node 39 is raised to $V_{cc}-V_t$ which activates the voltage coupler 65. Thus, a voltage potential of approximately 12 volts is supplied to the source of each of the memory cells 42(a–m)a1.

In this manner, the selected memory cell 42 is programmed when the associated column address line 26 is brought to ground potential or a low voltage dictated by the programming requirement. If the memory cell 42 is not desired to be programmed, the associated column address line 26 is brought to a potential of approximately +5 volts.

The disturbance on the unselected cells are as follows:

For the memory cells 42 in the same row, the voltages on the memory cells 42 are as follows:
DRAIN: +5 volts
GATE: $+V_t$
SOURCE: +12 volts Since the drain voltage of the unselected cell is 5 volts and the gate is $V_t$, the cell is cut-off and there is some, but negligible, disturbance. With such a small disturbance, it is possible to design a product to withstand its impact throughout the specified product life.

For the memory cells 42 in the immediate adjacent row 24, the voltages on the memory cells 42 are as follows:
SOURCE: +12 Volts
GATE: 0 volt
DRAIN 0 Volts or a low voltage in selected columns and +5 Volts in unselected columns Under these conditions, these cells 42 in the row immediately adjacent to the selected row could have some but negligible effect of programming disturbance, because the gate voltage is at ground. Again, with such small disturbance, it is possible to design a product to withstand its impact throughout the specified product life.

With respect to other unselected cells, i.e., cells 42 in row other than the immediate adjacent row, e,g, row 24n, the potential on the cells are as follows:
DRAIN: +5 Volts or 0 Volts to a low voltage
GATE - ground potential
SOURCE - ground potential In this condition, since there is no high voltage present on any of the unselected cells 42 in these other rows, there is no disturbance on any of these cells.

READ

Finally, since the voltage required to read the cells are typically on the order of +2 volts and +5 volts, low voltages, the read disturbance is also negligible in the unselected cells.

Although the invention has been described in the preferred embodiment as using the floating gate memory cell 42 as disclosed in U.S. patent application Ser. No. 682,459, filed on Apr. 9, 1991, the floating gate memory cell 42 as disclosed in U.S. Pat. No. 5,029,130 can also be used. In that application, the floating gate memory cell 42 have the following characteristics for operation.

|  | DRAIN | GATE | SOURCE |
|---|---|---|---|
| PROGRAM | +12 | $+V_t$ | 0 |
| ERASE | 0 | +15 | 0 |
| READ | +2 | +5 | 0 |

To use such a floating gate memory cell 42 in the array 40, the drain can be connected to the common line 36y2, the gate connected to the appropriate row line 36, and the source connected to the column address line 26.

As can be seen from the foregoing, by having a plurality of common lines, and further having additional row decode circuits and high voltage decode circuits, the high voltage source can be applied and the write disturbance can be limited to a particular row. Of course, the row decode circuit 50 can be made a part of the row address decoder 20.

What is claimed is:

1. An electrically programmable and erasable memory array device having a plurality of memory cells, each having a floating gate for the storage of charges thereon, said device comprising:
   a plurality of first address lines;
   a plurality of second address lines;
   a plurality of third address lines;
   each of said memory cells having three terminals, a first terminal connected to one of said first address lines, a second terminal connected to one of said second address lines, and a third terminal connected to one of said third address lines;
   high voltage source means for supplying a high voltage source;
   means for selecting certain of said plurality of first, certain of said plurality of second and certain of said plurality of third address lines for connecting to said high voltage source means to cause erasure of charges on the floating gate of the memory cells selected; and
   means for selecting certain of said plurality of first, certain of said plurality of second and certain of said plurality of third address lines for connecting to said high voltage source means to cause programming of charges on the floating gate of the memory cells selected.

2. The device of claim 1 further comprising:
   a grounding line, substantially parallel to said plurality of first address lines, intersecting each of said third address lines;
   switch means for connecting each of said third address lines to said grounding line.

3. The device of claim 2 wherein said switch means further comprises:
   a plurality of transistor means, each for connecting a third address line to said grounding line.

4. An electrically programmable and erasable memory array device having a plurality of memory cells, each having a floating gate for the storage of charges thereon, said device comprising:
   a plurality of first address lines;
   a plurality of second address lines;
   a plurality of third address lines;
   each of said memory cells having three terminals, a first terminal connected to one of said first address lines, a second terminal connected to one of said second address lines, and a third terminal connected to one of said third address lines;
   means for selecting certain of said first, second and third address lines for injecting hot electrons generated by abrupt potential drop onto the floating gate of a memory cell when the associated ones of the second address line and the third address line are raised to a first predetermined potential above that of the associated first address line, with the potential applied to said third address line being above the potential applied to said associated one of the second address lines; and
   means for selecting certain of said first, second and third address lines for inducing Fowler-Nordheim tunneling of charges from the floating gate to said second terminal when the associated second address line is raised to a second pre-determined potential above the associated first address line.

5. The device of claim 4 wherein said first address lines are column address lines, said second address lines are common address lines, and wherein each combination of one of the plurality of column address lines and one of the plurality of row address lines define a different one of the plurality of memory cells.

6. The device of claim 5 wherein said plurality of column address lines are substantially parallel to one another and said plurality of row address lines are substantially parallel to one another and with said column address lines substantially perpendicular to said row address lines.

7. The device of claim 6 wherein each of said plurality of common address lines has an associated row address line, is substantially parallel thereto, and connects to the third terminal of the memory cells to which the associated row address line is connected.

8. The device of claim 6 wherein each of said plurality of common address lines has two associated row address lines, is positioned therebetween and is substantially parallel thereto, said common address line connects to the third terminal of the memory cells to which the associated row address lines are connected.

9. The device of claim 8 further comprising:
   a plurality of grounding lines substantially parallel to said plurality of column address lines, intersecting each of said common address lines;
   switch means for connecting each of said common address lines to each of said grounding lines.

10. The device of claim 9 wherein said switch means further comprises: p1 a plurality of transistor means each for connecting a common address line to said grounding line, each of said transistor means further comprises:
    a source connected to said grounding line;
    a drain connected to said common address line; and
    a gate connected to the associated row address line.

11. The device of claim 10 wherein said grounding line is made of metal.

12. The device of claim 11 wherein each of said common address lines is made of metal, diffusion, silicide or polycide.

13. The device of claim 8 wherein each of said common address lines is made of metal, diffusion, silicide or polycide.

* * * * *